(12) United States Patent
Xu (10) Patent No.: US 11,302,764 B2
(45) Date of Patent: Apr. 12, 2022

(54) ARRAY SUBSTRATE AND FLEXIBLE DISPLAY PANEL

(71) Applicant: Wuhan China Star Optoelectronics Semiconductor Display Technology Co., Ltd., Wuhan (CN)

(72) Inventor: Zuzhao Xu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 157 days.

(21) Appl. No.: 16/638,754

(22) PCT Filed: Dec. 19, 2019

(86) PCT No.: PCT/CN2019/126748
§ 371 (c)(1),
(2) Date: Feb. 13, 2020

(87) PCT Pub. No.: WO2021/051691
PCT Pub. Date: Mar. 25, 2021

(65) Prior Publication Data
US 2021/0384278 A1    Dec. 9, 2021

(30) Foreign Application Priority Data
Sep. 19, 2019 (CN) .......................... 201910889322.9

(51) Int. Cl.
*G09G 3/00* (2006.01)
*H01L 27/32* (2006.01)
*G09G 3/3208* (2016.01)

(52) U.S. Cl.
CPC ......... *H01L 27/3276* (2013.01); *G09G 3/035* (2020.08); *G09G 3/3208* (2013.01);
(Continued)

(58) Field of Classification Search
CPC . H01L 27/3258; H01L 51/0097; G09G 3/035; G09G 9/301; G06F 1/1652
See application file for complete search history.

(56) References Cited

U.S. PATENT DOCUMENTS

2005/0142679 A1*  6/2005 Ahn ................. G02F 1/136286
                                                                  438/30
2015/0014680 A1    1/2015 Yamazaki et al.
(Continued)

FOREIGN PATENT DOCUMENTS

CN           109065616          12/2018
CN           109560087           4/2019
(Continued)

*Primary Examiner* — Kevin M Nguyen (57) ABSTRACT

The present disclosure provides an array substrate and a flexible display panel. A source/drain of the array substrate is connected to an active terminal of an active layer through a second through-hole, and is connected to a first metal terminal of a first metal layer through a third through-hole, and is connected to a second metal terminal of a second metal layer through a fourth through-hole. A distance between the second through-hole and the first through-hole is greater than a predetermined distance, which reduces the impact of film segment difference and relieve the problem of faults in source/drain in the current flexible display panels.

20 Claims, 5 Drawing Sheets

(52) U.S. Cl.
CPC . *H01L 27/3258* (2013.01); *G09G 2300/0842* (2013.01); *G09G 2310/061* (2013.01); *H01L 2251/5338* (2013.01)

(56) References Cited

U.S. PATENT DOCUMENTS

| | | | |
|---|---|---|---|
| 2019/0081122 A1* | 3/2019 | Kim | H01L 27/3248 |
| 2019/0273124 A1* | 9/2019 | Leng | H01L 51/0097 |
| 2019/0348485 A1* | 11/2019 | Jo | H01L 27/323 |
| 2020/0201391 A1 | 6/2020 | Bai et al. | |
| 2021/0028195 A1 | 1/2021 | Xu et al. | |
| 2021/0225978 A1 | 7/2021 | Lim et al. | |

FOREIGN PATENT DOCUMENTS

| | | |
|---|---|---|
| CN | 110190073 | 8/2019 |
| KR | 2019-0073848 | 6/2019 |

* cited by examiner

333
ARRAY SUBSTRATE AND FLEXIBLE DISPLAY PANEL

RELATED APPLICATIONS

This application is a National Phase of PCT Patent Application No. PCT/CN2019/126748 having International filing date of Dec. 19, 2019, which claims the benefit of priority of Chinese Patent Application No. 201910889322.9 filed on Sep. 19, 2019. The contents of the above applications are all incorporated by reference as if fully set forth herein in their entirety.

FIELD AND BACKGROUND OF THE INVENTION

The present disclosure relates to the display technology field, and more particularly, to an array substrate and a flexible display panel.

Due to their high flexibility, foldability, and portability, flexible display devices have gradually become a key developing technology in the new generation of display fields.

At present, in the manufacturing process of flexible display panels, a key step to achieve panel flexibility is to dig holes in a display region with low stress and low flexibility in an inorganic film layer and form a flexible organic material layer in the holes and on the inorganic film layer before forming source/drain, which improves bending performance of panels. However, the use of an organic material layer leads to an increase in the film segment difference, which causes faults in source/drain in the subsequent process so that data signals cannot be written.

Thus, current flexible display panels have the problem of faults in source/drain, which needs to be resolved.

SUMMARY OF THE INVENTION

The present disclosure provides an array substrate and a flexible display panel to relieve the problem of faults in source/drain in the current flexible display panels.

To resolve the above problems, the present disclosure provides technical schemes as below.

The present disclosure provides an array substrate, the array substrate comprises a substrate, an active layer formed on the substrate, a first insulating layer formed on the active layer, a first metal layer formed on the first insulating layer, a second insulating layer formed on the first metal layer, a second metal layer formed on the second insulating layer, a third insulating layer formed on the second metal layer, a transparent filling layer formed on the third insulating layer and connected to the substrate through a first through-hole, and a source/drain formed on the transparent filling layer. The source/drain is connected to an active terminal of the active layer through a second through-hole, and is connected to a first metal terminal of the first metal layer through a third through-hole, and is connected to a second metal terminal of the second metal layer through a fourth through-hole.

Wherein a diameter of the second through-hole is greater than a diameter of the third through-hole and a diameter of the fourth through-hole, and a distance between the second through-hole and the first through-hole is greater than a predetermined distance.

In an array substrate provided by the present disclosure, the active layer is patterned to form an active region, and the active region comprises a doped region and a channel region. The first metal layer is patterned to form a gate, a first scan line, a second scan line, a third scan line, a light-emitting control line, and a first electrode plate of a storage capacitor. The second metal layer is patterned to form a second electrode plate of the storage capacitor. The the source, the drain, a data signal line, a power signal line, a first connecting line, and a second connecting line are patterned to be formed. The source and the drain are connected to the doped region through the second through-hole, one terminal of the first connecting line is connected to the active terminal of the active layer through the second through-hole, and the other terminal of the first connecting line is connected to the first electrode plate through the third through-hole. One terminal of the second connecting line is connected to the active terminal of the active layer through the second through-hole. The power signal line is connected to the second electrode plate through the fourth through-hole.

In an array substrate provided by the present disclosure, the data signal line, the power signal line, the first connecting line, and the second connecting line are arranged in parallel.

In an array substrate provided by the present disclosure, the first electrode plate is formed opposite to the second electrode plate, and a projection of the second electrode plate on the substrate covers a projection of the first electrode plate on the substrate.

In an array substrate provided by the present disclosure, the diameter of the third through-hole is greater than or equal to the diameter of the fourth through-hole.

In an array substrate provided by the present disclosure, the diameter of the second through-hole is greater than 2.5 µm.

In an array substrate provided by the present disclosure, the diameter of the second through-hole is 3 µm, 3.5 µm, or 4 µm.

In an array substrate provided by the present disclosure, the distance between the second through-hole and the first through-hole is greater than 3 µm.

In an array substrate provided by the present disclosure, the array substrate comprises a plurality of pixel driving circuits, the pixel driving circuits comprises a first thin film transistor, a second thin film transistor, a third thin film transistor, a fourth thin film transistor, a fifth thin film transistor, a sixth thin film transistor, a seventh thin film transistor, and a storage capacitor. A drain of the first thin film transistor is electrically connected to a source of the fifth thin film transistor and a source of the second thin film transistor, a source of the first thin film transistor is electrically connected to a drain of the third thin film transistor and a drain of the sixth thin film transistor, a gate of the first thin film transistor is electrically connected to a source of the third thin film transistor, a drain of the fourth thin film transistor, and a first electrode plate of the storage capacitor, a second electrode plate of the storage capacitor is electrically connected to a drain of the fifth thin film transistor, a gate of the fifth thin film transistor is electrically connected to a gate of the sixth thin film transistor, a source of the sixth thin film transistor is electrically connected to a drain of the seventh thin film transistor, and a source of the seventh thin film transistor is electrically connected to a source of the fourth thin film transistor.

In an array substrate provided by the present disclosure, the gate of the fifth thin film transistor and the gate of the sixth thin film transistor are connected to a light-emitting control signal, the drain of the fifth thin film transistor is connected to a power signal, a drain of the second thin film transistor is connected to a data signal, a gate of the second thin film transistor and a gate of the third thin film transistor are connected to a first scan signal, a gate of the fourth thin film transistor is connected to a second scan signal, and a gate of the seventh thin film transistor is connected to a third scan signal.

Meanwhile, the present disclosure further provides a flexible display panel comprising an array substrate, the array substrate comprises a substrate, an active layer formed on the substrate, a first insulating layer formed on the active layer, a first metal layer formed on the first insulating layer, a second insulating layer formed on the first metal layer, a second metal layer formed on the second insulating layer, a third insulating layer formed on the second metal layer, a transparent filling layer formed on the third insulating layer and connected to the substrate through a first through-hole, and a source/drain formed on the transparent filling layer. The source/drain is connected to an active terminal of the active layer through a second through-hole, and is connected to a first metal terminal of the first metal layer through a third through-hole, and is connected to a second metal terminal of the second metal layer through a fourth through-hole.

Wherein a diameter of the second through-hole is greater than a diameter of the third through-hole and a diameter of the fourth through-hole, and a distance between the second through-hole and the first through-hole is greater than a predetermined distance.

In an array substrate provided by the present disclosure, the active layer is patterned to form an active region, and the active region comprises a doped region and a channel region. The first metal layer is patterned to form a gate, a first scan line, a second scan line, a third scan line, a light-emitting control line, and a first electrode plate of a storage capacitor. The second metal layer is patterned to form a second electrode plate of the storage capacitor. The the source, the drain, a data signal line, a power signal line, a first connecting line, and a second connecting line are patterned to be formed. The source and the drain are connected to the doped region through the second through-hole, one terminal of the first connecting line is connected to the active terminal of the active layer through the second through-hole, and the other terminal of the first connecting line is connected to the first electrode plate through the third through-hole. One terminal of the second connecting line is connected to the active terminal of the active layer through the second through-hole. The power signal line is connected to the second electrode plate through the fourth through-hole.

In an array substrate provided by the present disclosure, the data signal line, the power signal line, the first connecting line, and the second connecting line are arranged in parallel.

In an array substrate provided by the present disclosure, the first electrode plate is formed opposite to the second electrode plate, and a projection of the second electrode plate on the substrate covers a projection of the first electrode plate on the substrate.

In an array substrate provided by the present disclosure, the diameter of the third through-hole is greater than or equal to the diameter of the fourth through-hole.

In an array substrate provided by the present disclosure, the diameter of the second through-hole is greater than 2.5 µm.

In an array substrate provided by the present disclosure, the diameter of the second through-hole is 3 µm, 3.5 µm, or 4 µm.

In an array substrate provided by the present disclosure, the distance between the second through-hole and the first through-hole is greater than 3 µm.

In an array substrate provided by the present disclosure, the array substrate comprises a plurality of pixel driving circuits, the pixel driving circuits comprises a first thin film transistor, a second thin film transistor, a third thin film transistor, a fourth thin film transistor, a fifth thin film transistor, a sixth thin film transistor, a seventh thin film transistor, and a storage capacitor. A drain of the first thin film transistor is electrically connected to a source of the fifth thin film transistor and a source of the second thin film transistor, a source of the first thin film transistor is electrically connected to a drain of the third thin film transistor and a drain of the sixth thin film transistor, a gate of the first thin film transistor is electrically connected to a source of the third thin film transistor, a drain of the fourth thin film transistor, and a first electrode plate of the storage capacitor, a second electrode plate of the storage capacitor is electrically connected to a drain of the fifth thin film transistor, a gate of the fifth thin film transistor is electrically connected to a gate of the sixth thin film transistor, a source of the sixth thin film transistor is electrically connected to a drain of the seventh thin film transistor, and a source of the seventh thin film transistor is electrically connected to a source of the fourth thin film transistor.

In an array substrate provided by the present disclosure, the gate of the fifth thin film transistor and the gate of the sixth thin film transistor are connected to a light-emitting control signal, the drain of the fifth thin film transistor is connected to a power signal, a drain of the second thin film transistor is connected to a data signal, a gate of the second thin film transistor and a gate of the third thin film transistor are connected to a first scan signal, a gate of the fourth thin film transistor is connected to a second scan signal, and a gate of the seventh thin film transistor is connected to a third scan signal.

The present disclosure provides an array substrate and a flexible display panel, and the array substrate comprises a substrate, an active layer, a first insulating layer, a first metal layer, a second insulating layer, a second metal layer, a transparent filling layer, and a, which are arranged in a stack. The source/drain is connected to an active terminal of the active layer through a second through-hole, and is connected to a first metal terminal of the first metal layer through a third through-hole, and is connected to a second metal terminal of the second metal layer through a fourth through-hole, wherein a diameter of the second through-hole is greater than a diameter of the third through-hole and a diameter of the fourth through-hole, and a distance between the second through-hole and the first through-hole is greater than a predetermined distance. A risk of faults caused by excessive segment differences is reduced by increasing the diameter of the second through-hole with a larger segment difference. Due to filling of the first through-hole, the transparent filling layer near the first through-hole is uneven, which causes faults in a subsequent manufacturing process of source/drain and relieves the problem of the faults in source/drain in the current flexible display panels.

DESCRIPTION OF SPECIFIC EMBODIMENTS OF THE INVENTION

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers.

The present disclosure is directed to the problem of faults in source/drain in the current flexible display panels to provide an array substrate, which may relieve the problem.

Figure 1:
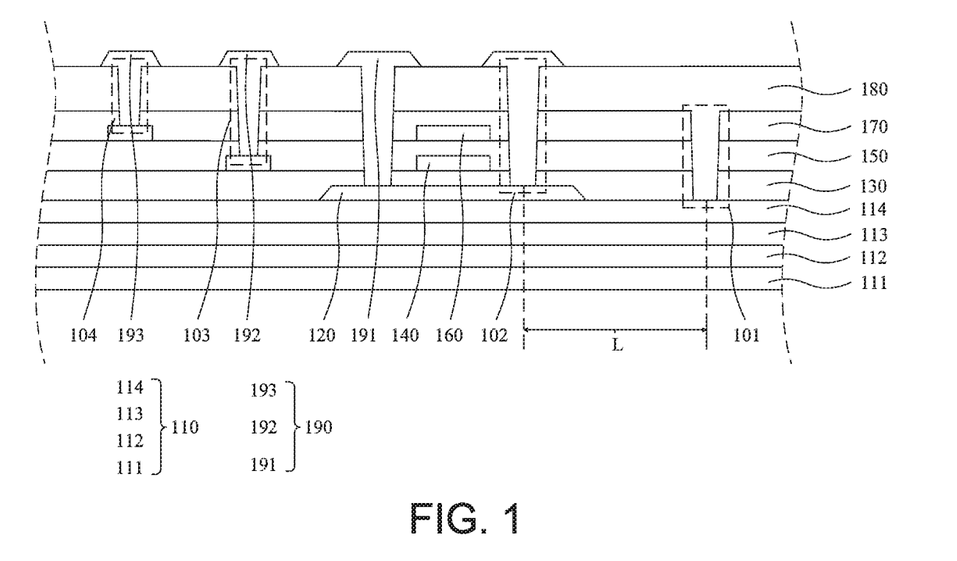
FIG. 1 is a schematic structural diagram of an array substrate provided by an embodiment of the present disclosure.

In one embodiment, as shown in FIG. 1, the present disclosure provides an array substrate. The array substrate comprises a substrate 110, wherein the substrate 110 is a flexible substrate and comprises a first flexible substrate 111, a barrier layer 112, a second flexible substrate 113, and a buffer layer 114, an active layer 120 formed on the substrate 110, a first insulating layer 130 formed on the active layer 120 and covering the substrate 110 and the active layer 120, a first metal layer 140 formed on the first insulating layer 130, a second insulating layer 150 formed on the first metal layer 140 and covering the first insulating layer 130 and the first metal layer 140, a second metal layer 160 formed on the second insulating layer 150, a third insulating layer 170 formed on the second metal layer 160 and covering the second insulating layer 150 and the second metal layer 160, a transparent filling layer 180 formed on the third insulating layer 170 and contacting to the substrate 110 through a first through-hole 101, and a source/drain 190 formed on the transparent filling layer 180. The source/drain 190 is connected to an active terminal of the active layer 120 through a second through-hole 102, and is connected to a first metal terminal of the first metal layer 140 through a third through-hole 103, and is connected to a second metal terminal of the second metal layer 160 through a fourth through-hole 104.

Wherein a diameter of the second through-hole 102 is greater than diameters of the third through-hole 103 and the fourth through-hole 104, and a distance L from the second through-hole 102 to the first through-hole 101 is greater than a predetermined distance.

An embodiment of the present disclosure provides an array substrate, a source/drain is connected to the active terminal of an active layer through a second through-hole, and is connected to a first metal terminal of a first metal layer through a third through-hole, and is connected to a second metal terminal of a second metal layer through a fourth through-hole, wherein a diameter of the second through-hole is greater than a diameter of the third through-hole and a diameter of the fourth through-hole, and a distance between the second through-hole and the first through-hole is greater than a predetermined distance. A risk of source/drain faults caused by excessive segment differences is reduced by increasing the diameter of the second through-hole with a larger segment difference. Meanwhile, in the process of increasing the distance between the second through-hole and the first through-hole and reducing a transparent filling layer, due to filling of the first through-hole, the transparent filling layer near the first through-hole is uneven, which causes faults in a subsequent manufacturing process of source/drain and relieves the problem of the faults in source/drain in the current flexible display panels.

In one embodiment, materials of a first flexible substrate 111 and a second flexible substrate 113 are usually organic polymer materials such as polyacetamide and polyethylene terephthalate. A material of a barrier layer 112 is generally silicon oxide, which is used for blocking foreign particles from entering the substrate and to isolate water and oxygen. A buffer layer 114 generally uses a stacked structure of silicon nitride (SiNx) and silicon oxide (SiOx). Silicon nitride has a stronger ion blocking ability and a good water and oxygen isolation ability, which may effectively prevent impurities from diffusing into thin film transistors during a thermal process. An interface between silicon oxide and polysilicon has better wettability and may be better used as a base material for forming an active layer.

Figure 2:
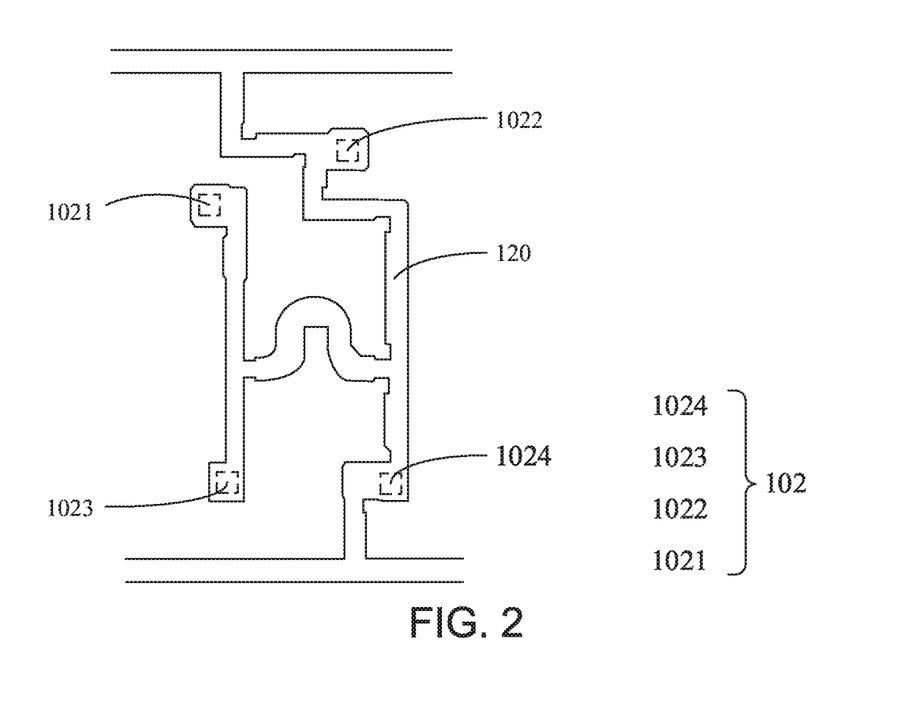
FIG. 2 is a schematic planar structural diagram of an active layer of the array substrate provided by the embodiment of the present disclosure.

An active layer 120 is formed on the buffer layer 114. As shown in FIG. 2, the active layer 120 is patterned to form an active region, and the active region comprises a doped region and a channel region. A material of the active layer 120 is generally amorphous silicon or polysilicon. Local positions on the active region respectively correspond to a second through-hole 1021, a second through-hole 1022, a second through-hole 1023, and a second through-hole 1024. A first insulating layer 130 covers the buffer layer 114 and the active layer 120. A material of the first insulating layer 130 is silicon oxide. Surfaces of silicon oxide and polysilicon have good matching grain boundary and stress and good step coverage.

Figure 3:
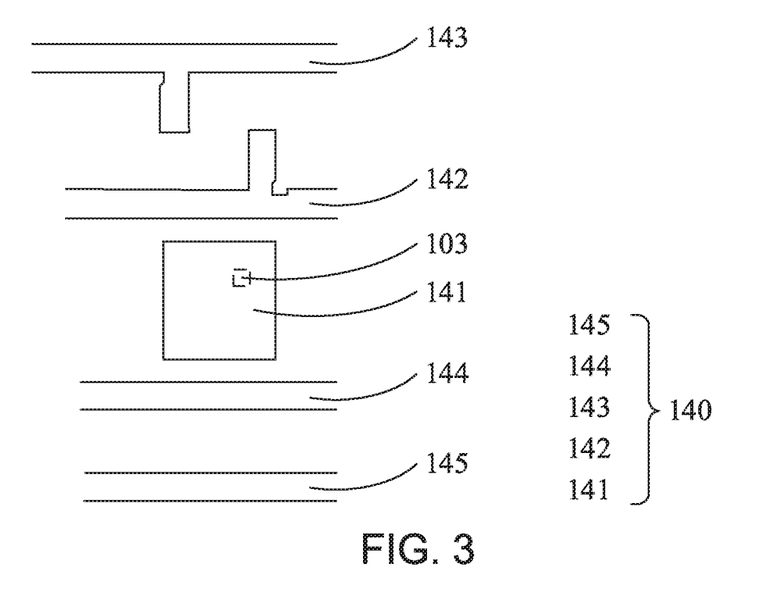
FIG. 3 is a schematic planar structural diagram of a first metal layer of the array substrate provided by the embodiment of the present disclosure.

A first metal layer 140 is formed on the first insulating layer 130. As shown in FIG. 3, the first metal layer 140 is patterned to form a first electrode plate 141 of a storage capacitor, a first scan line 142, a second scan line 143, a light-emitting control line 144, and a third scan line 145. A material of the first metal layer is generally molybdenum (Mo). A local position on the first electrode plate 141 of the storage capacitor corresponds to a third through-hole 102. A second insulating layer 150 covers the first insulating layer 130 and the first metal layer 140. A material of the second insulating layer 150 is silicon nitride.

Figure 4:
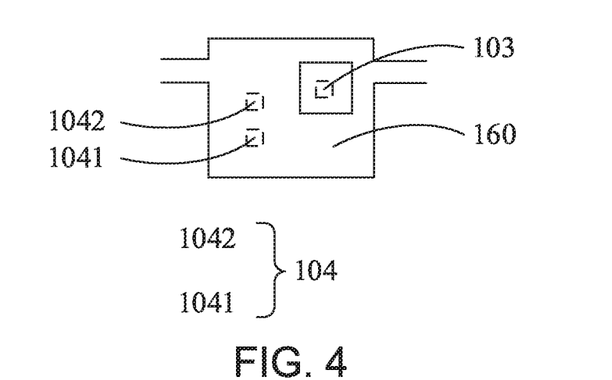
FIG. 4 is a schematic planar structural diagram of a second metal layer of the array substrate provided by the embodiment of the present disclosure.

A second metal layer 160 is formed on the second insulating layer 150. As shown in FIG. 4, the second metal layer 160 is patterned to form a second electrode plate of the storage capacitor. The second electrode plate is hollowed out in a region where the third through-hole 103 is formed, which prevents a metal from being connected to the second electrode plate when the first metal terminal of the first metal layer is connected to the third through-hole 103. A material of the second metal layer is generally molybdenum (Mo). A material of the third insulating layer 170 generally is a stacked structure of silicon nitride (SiNx) and silicon oxide (SiOx).

Figure 5:
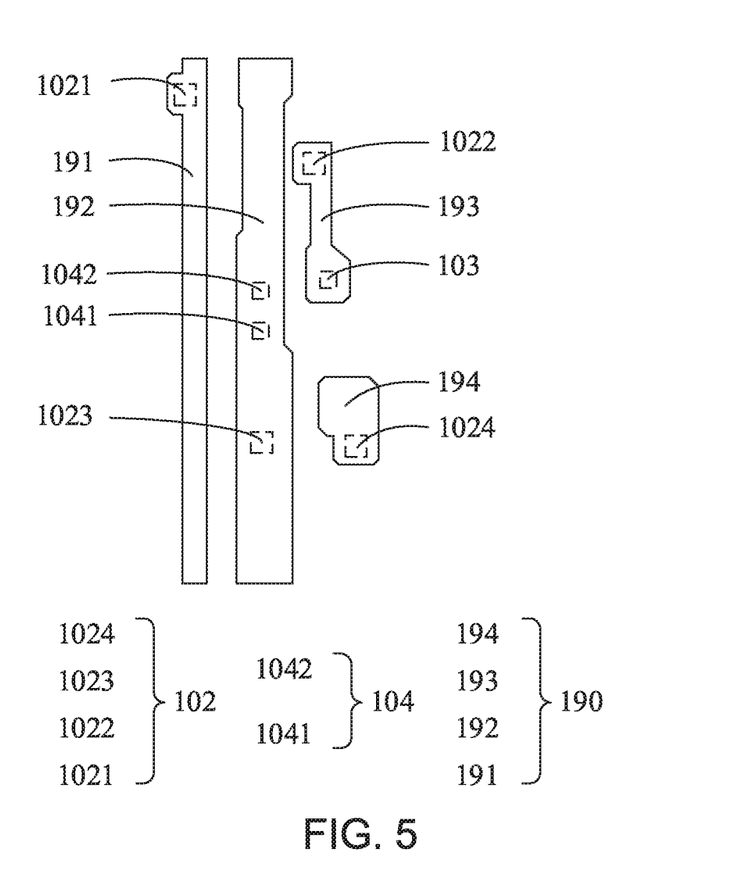
FIG. 5 is a schematic planar structural diagram of a source/drain of the array substrate provided by the embodiment of the present disclosure.

A source/drain 190 is formed on the third insulating layer 170. As shown in FIG. 5, the source/drain 190 is patterned to form a data signal line 191, a power signal line 192, a first connecting line 193, and a second connecting line 194. The data signal line 191, the power signal line 192, the first connecting line 193, and the second connecting line 194 are arranged in parallel. Local positions of the data signal line 191, the power signal line 192, the first connecting line 193, and the second connecting line 194 respectively correspond to the second through-hole 1021, the second through-hole 1022, the second through-hole 1023, the second through-hole 1024, and a fourth through-hole 1042. A local position on the first connection line 193 corresponds to the third through-hole 103, a local position on the second connection line 194 corresponds to a fourth through-hole 1041 and the fourth through-hole 1042, and a diameter of a second through-hole 102 is greater than diameters of the third through-hole 103 and a fourth through-hole 104. The source/drain 190 is generally a stacked structure of titanium, aluminum, and titanium (Ti, Al, and Ti).

The 190 is generally formed by a metal sputtering method. When metal encounters a through-hole in a sputtering process, since sputtered metal not only forms a flat metal layer structure, but also fills a hole structure in the through-hole, a demand of metal in a position of the through-hole is greater than that in other positions. If an amount of the sputtered metal is insufficient, requirements for the metal to extend from top of the through-hole to bottom of the through-hole cannot be satisfied. In this way, a problem of faults will occur. With the same diameter, the greater the depth of the through-hole, the higher the risk of faults.

When the depth of the through-hole cannot be changed, the diameter of the through-hole can be increased, thereby increasing the amount of the sputtered metal within the through-hole ranges, and increasing metal deposited from the top of the through-hole to the bottom of the through-hole, so that a continuity of the metal from the top of the through-hole to the bottom of the through-hole is satisfied and prevents source/drain from faults.

The second through-hole 102 is connected to the active terminal of the active layer 120 and the source/drain 190, the third through-hole 103 is connected to the first metal terminal of the first metal layer 140 and source/drain 190, and the fourth through-hole 104 is connected to the second metal terminal of the second metal layer and the source/drain 190. Thus, a depth of the second through-hole 102 is greater than a depth of the third through-hole 103, and a depth of the third through-hole 103 is greater than a depth of the fourth through-hole 104. That is, a risk of source/drain faults in the second through-hole 102 is higher than a risk of faults in the third through-hole 103, and a risk of faults in the third through-hole 103 is higher than a risk of faults in the fourth through-hole 104.

The risk of source/drain faults caused by excessive segment differences is reduced by increasing a diameter of the second through-hole 102 with a deeper depth and a larger segment difference.

In one embodiment, a diameter of the second through-hole 102 is greater than diameters of the third through-hole 103 and the fourth through-hole 104. The diameter of the second through-hole 102 is greater than 2.5 µm, and the diameter of the second through-hole may be 3 µm, 3.5 µm, 4 µm, or other values. A diameter of the third through-hole 103 may be greater than a diameter of the fourth through-hole 104, or may be equal to a diameter of the fourth through-hole 104.

Figure 6:
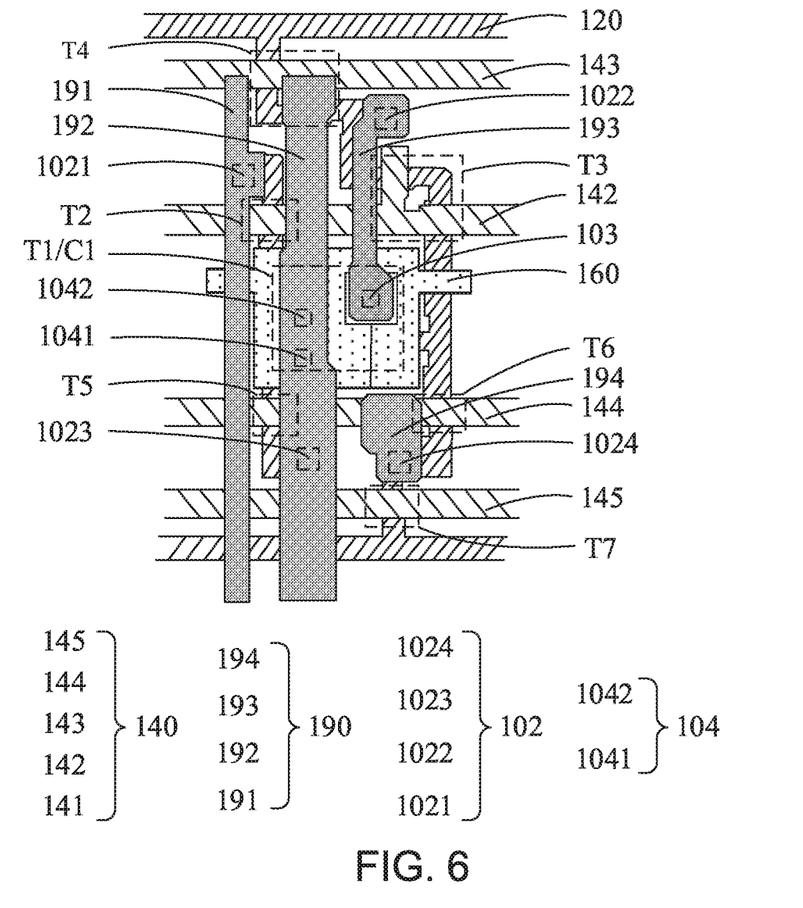
FIG. 6 is a schematic planar structural diagram of the active layer, the first metal layer, the second metal layer, and the source/drain arranged in a stack of the array substrate provided by the embodiment of the present disclosure.
Figure 7:
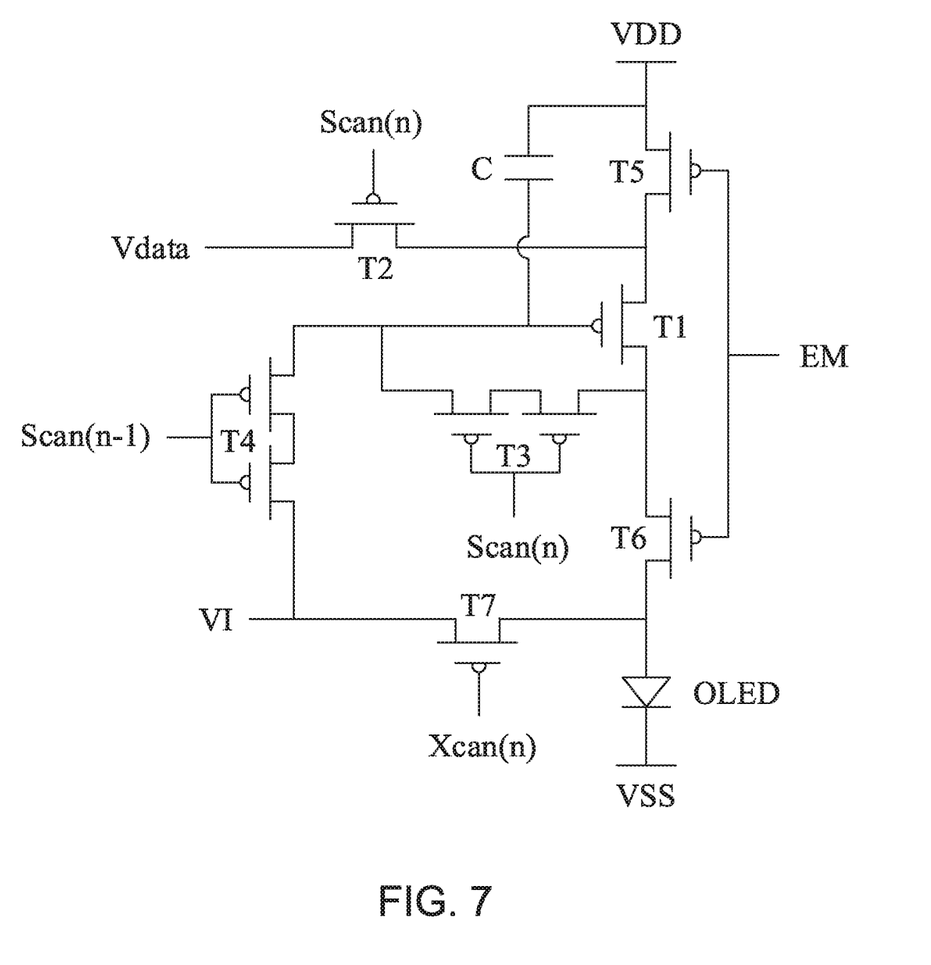
FIG. 7 is a pixel driving circuit diagram of the array substrate provided by the embodiment of the present disclosure.

FIG. 6 is a schematic planar superimposing structural diagram obtained by each film layer structures superimposed shown in the above FIG. 2 to FIG. 5. FIG. 7 is a circuit diagram of an array substrate provided by an embodiment of the present disclosure, and the circuit diagram is a 7T1C circuit diagram and corresponds to film layer structures shown in FIG. 6. An array substrate provided in the present disclosure will be further explained below with reference to FIG. 6 and FIG. 7.

An array substrate comprises a plurality of pixel driving circuits. As shown in FIG. 7, the pixel driving circuits comprise a first thin film transistor T1, a second thin film transistor T2, a third thin film transistor T3, a fourth thin film transistor T4, a fifth thin film transistor T5, a sixth thin film transistor T6, a seventh thin film transistor T7, and a storage capacitor C.

A drain of the first thin film transistor T1 is electrically connected to a source of the fifth thin film transistor T5 and a source of the second thin film transistor T2, a source of the first thin film transistor T1 is electrically connected to a drain of the third thin film transistor T3 and a drain of the sixth thin film transistor T6, a gate of the first thin film transistor T1 is electrically connected to a source of the third thin film transistor T3, a drain of the fourth thin film transistor T4, and a first electrode plate of the storage capacitor C, a second electrode plate of the storage capacitor C is electrically connected to a drain of the fifth thin film transistor T5, a gate of the fifth thin film transistor T5 is electrically connected to a gate of the sixth thin film transistor T6, a source of the sixth thin film transistor T6 is electrically connected to a drain of the seventh thin film transistor T7, and an anode of a light-emitting diode OLED, and a source of the seventh thin film transistor T7 is electrically connected to a source of the fourth thin film transistor T4.

A drain of the second thin film transistor T2 is connected to a data signal Vdata, a gate of the second thin film transistor T2 is electrically connected to a first scan signal Scan(n), the drain of the fifth thin film transistor T5 is connected to a power signal VDD, a gate of the third thin film transistor T3 is connected to the first scan signal Scan (n), a gate of the fourth thin film transistor T4 is connected to a second scan signal Scan (n−1), a gate of the seventh thin film transistor T7 is connected to a third scanning signal Xcan (n), the gate of the fifth thin film transistor T5 and the gate of the sixth thin film transistor T6 are connected to a light-emitting control signal EM, and the source of the seventh thin film transistor T7 and the source of the fourth thin film transistor T4 are connected to a reset signal VI.

Wherein, the first scan signal Scan (n) is used for controlling the second thin film transistor T2 and the third thin film transistor T3 to turn on and off, the second scan signal Scan (n−1) is used for controlling the fourth thin film transistor T4 to turn on and off, the third scan signal Xcan (n) is used for controlling the seventh thin film transistor T7 on and off, and the light-emitting control signal EM is used for controlling the fifth thin film transistor T5 and the sixth thin film transistor T6 to turn on and off. The data signal Vdata is input when the second thin film transistor T2 is turned on, the power signal VDD is input when the fifth thin film transistor is turned on, and the reset signal VI is input when the fourth thin film transistor T4 is turned on, or when the seventh thin film transistor T7 is turned on.

The first thin film transistor T1 is a driving transistor for driving OLEDs to light-emitting display. The second thin film transistor T2 is used for storing the data signal Vdata to the storage capacitor C under the control of the first scan signal Scan(n). The third thin film transistor T3 is used for storing a threshold signal of the first thin film transistor T1 to the storage capacitor C under the control of the first scan signal Scan(n). The fourth thin film transistor T4 is used for providing the reset signal VI to the storage capacitor C under the control of the second scan signal line Scan(n−1), and the reset signal VI is used for resetting the storage capacitor C. The fifth thin film transistor T5 is used for providing the power signal VDD to the drain of the first thin film transistor T1 under the control of the light-emitting control signal EM. The sixth thin film transistor T6 is used for conducting the source of the first thin film transistor T1 and the anode of the light-emitting diode OLED under the control of the light-emitting control signal EM. The seventh thin film transistor T7 is used for providing the reset signal VI to the anode of the light-emitting diode OLED under the control of the first scan signal Scan(n), and the reset signal VI is used for resetting the anode voltage of the light-emitting diode OLED.

FIG. 6 is a schematic planar superimposing diagram of each film layers in an array substrate of the present disclosure comprising an active layer 120, a first metal layer 140, a second metal layer 160, and a source/drain 190, which are arranged in a stack.

The active layer 120 is patterned to form an active region, and the active region comprises a doped region and a channel region. The first metal layer 140 is patterned to form a first electrode plate 141 of a storage capacitor C, a first scan line 142, a second scan line 143, a light-emitting control line 144, and a third scan line 145. A portion where the first metal layer 140 overlaps with the channel region of the active layer 120 forms a gate of a thin film transistor, and the doped regions at both ends of the channel region respectively form a source and a drain of the thin film transistor.

Thus, it should be known that in FIG. 6, the array substrate of the present disclosure forms a first thin film transistor T1, a second thin film transistor T2, a third thin film transistor T3, a fourth thin film transistor T4, a fifth thin film transistor T5, a sixth thin film transistor T6, and a seventh thin film transistor T7. Wherein the first scan signal line 142 provides a first scan signal Scan(n) to a gate of the second thin film transistor T2 and the gate of the third thin film transistor T3, the second scan signal line 143 provides a second scan signal Scan(n−1) to a gate of the fourth thin film transistor T4, the light-emitting control signal line 144 provides a light-emitting control signal EM to a gate of the fifth thin film transistor T5 and a gate of the sixth thin film transistor T6, and the third scan signal line 145 provides a third scan signal Xcan(n) to a gate of the seventh thin film transistor T7.

The second metal layer 160 is patterned to form a second electrode plate of the storage capacitor C, which is disposed opposite to the first electrode plate of the storage capacitor in the first metal layer 140. A projection of the second electrode plate on the substrate covers a projection of the first electrode plate on the substrate. The first electrode plate and the second electrode plate form the storage capacitor C together.

The source/drain 190 is patterned to form a data signal line 191, a power signal line 192, a first connecting line 193, and a second connecting line 194. The data signal line 191 is connected to the active terminal of the active layer through a second through-hole 1021, thereby transmitting the data signal Vdata to the drain of the second thin film transistor T2. The power signal line 192 is connected to the active terminal of the active layer through a second through-hole 1023, thereby transmitting the power signal VDD to the drain of the fifth thin film transistor T5. The power signal line 192 is connected to the second electrode plate of the storage capacitor C through a fourth through-hole 1041 and a fourth through-hole 1042, thereby transmitting the power signal VDD to the second electrode plate of the storage capacitor C.

Because the active region is integrated, it should be known that the source of the second thin film transistor T2 is connected to the drain of the first thin film transistor T1 and the source of the fifth thin film transistor T5, the source of the first thin film transistor T1 is connected to the drain of the third thin film transistor T3 and the drain of the sixth thin film transistor T6, the source of the third thin film transistor T3 is connected to the drain of the fourth thin film transistor, and the source of the sixth thin film transistor T6 is connected to the source of the seventh thin film transistor T7.

One terminal of the first connecting line 193 is connected to the active terminal of the active layer through the second through-hole 1022, and the other terminal of the first connecting line 193 is connected to the first electrode plate of the storage capacitor C through the third through-hole 103, so that the first electrode plate of the storage capacitor C is connected to the gate of the first thin film transistor T1, the source of the third thin film transistor T3, and the drain of the fourth thin film transistor T4.

One terminal of the second connection line 194 is connected to the active terminal of the active layer through the second through-hole 1024, and the other terminal of the second connection line 194 is connected to the light-emitting diode OLED (not shown).

The source of the fourth thin film transistor T4 and the source of the seventh thin film transistor T7 are connected to a reset signal line of a same layer, thereby obtaining a reset signal.

In one embodiment, the transparent filling layer 180 is an organic material. In a process of forming the transparent filling layer 180, because the organic material fills the first through-hole 101, this leads to a depression formed at a position corresponding to the first through-hole 101 and its surrounding on the transparent filling layer 180. This will cause the metal material to converge to the depression during the subsequent sputtering process of, thereby causing a risk of metal layer faults around the depression, and the closer the depression gets to the first through-hole, the higher the risk of faults will be. In order to prevent the risk of further faults in the source drain layer 190, the distance between the second through-hole 102 and the first through-hole 101 needs to be set as far as possible.

In one embodiment, the distance L between the second through-hole 102 and the first through-hole 101 must be at least greater than 3 μm. However, it is limited by other setting conditions of the panels, and the distance between the first through-hole and the second through-hole cannot be infinitely far. There are specific settings made according to the needs of the panel, which is not limited here.

Meanwhile, an embodiment of the present disclosure further provides a flexible display panel, and the flexible display panel comprises an array substrate. The array substrate comprises a substrate, an active layer formed on the substrate, a first insulating layer formed on the active layer, a first metal layer formed on the first insulating layer, a second insulating layer formed on the first metal layer, a second metal layer formed on the second insulating layer, a third insulating layer formed on the second metal layer, a transparent filling layer formed on the third insulating layer and contacting to the substrate through a first through-hole, and a source/drain formed on the transparent filling layer. The source/drain is connected to the active terminal of the active layer through a second through-hole, and is connected to the first metal terminal of the first metal layer through a third through-hole, and is connected to a second metal terminal of the second metal layer through a fourth through-hole.

Wherein a diameter of the second through-hole is greater than a diameter of the third through-hole and a diameter of the fourth through-hole, and a distance between the second through-hole and the first through-hole is greater than a predetermined distance.

An embodiment of the present disclosure provides a flexible display panel, the flexible display panel comprises an array substrate, a source/drain is connected to an active terminal of an active layer through a second through-hole, and is connected to a first metal terminal of a first metal layer through a third through-hole, and is connected to a second metal terminal of a second metal layer through a fourth through-hole. Wherein a diameter of the second through-hole is greater than a diameter of the third through-hole and a diameter of the fourth through-hole, and a distance between the second through-hole and the first through-hole is greater than a predetermined distance. A risk of faults caused by excessive segment differences is reduced by increasing the diameter of the second through-hole with a large segment difference. Meanwhile, in the process of increasing the distance between the second through-hole and the first through-hole and reducing a transparent filling layer, due to filling of the first through-hole, the transparent filling layer near the first through-hole is uneven, which causes faults in manufacturing process of subsequent source/drain and relieves the problem of the faults in source/drain in the current flexible display panels.

In one embodiment, the active layer is patterned to form an active region, and the active region comprises a doped region and a channel region. The first metal layer is patterned to form a gate, a first scan line, a second scan line, a third scan line, a light-emitting control line, and a first electrode plate of a storage capacitor. The second metal layer is patterned to form a second electrode plate of the storage capacitor. The source/drain layer the source, the drain, a data signal line, a power signal line, a first connecting line, and a second connecting line are patterned to be formed. The source and the drain are connected to the doped region through the second through-hole, one terminal of the first connecting line is connected to the active terminal of the active layer through the second through-hole, and the other terminal of the first connecting line is connected to the first electrode plate through the third through-hole. One terminal of the second connecting line is connected to the active terminal of the active layer through the second through-hole. The power signal line is connected to the second electrode plate through the fourth through-hole.

In one embodiment, the data signal line, the power signal line, the first connecting line, and the second connecting line are arranged in parallel.

In one embodiment, the first electrode plate is formed opposite to the second electrode plate, and a projection of the second electrode plate on the substrate covers a projection of the first electrode plate on the substrate.

In one embodiment, the diameter of the third through-hole is greater than or equal to the diameter of the fourth through-hole.

In one embodiment, the diameter of the second through-hole is greater than 2.5 μm.

In one embodiment, the diameter of the second through-hole is 3 μm, 3.5 μm, or 4 μm.

In one embodiment, the distance between the second through-hole and the first through-hole is greater than 3 μm.

In one embodiment, the array substrate comprises a plurality of pixel driving circuits, the pixel driving circuits comprises a first thin film transistor, a second thin film transistor, a third thin film transistor, a fourth thin film transistor, a fifth thin film transistor, a sixth thin film transistor, a seventh thin film transistor, and a storage capacitor. A drain of the first thin film transistor is electrically connected to a source of the fifth thin film transistor and a source of the second thin film transistor, a source of the first thin film transistor is electrically connected to a drain of the third thin film transistor and a drain of the sixth thin film transistor, a gate of the first thin film transistor is electrically connected to a source of the third thin film transistor, a drain of the fourth thin film transistor, and a first electrode plate of the storage capacitor, a second electrode plate of the storage capacitor is electrically connected to a drain of the fifth thin film transistor, a gate of the fifth thin film transistor is electrically connected to a gate of the sixth thin film transistor, a source of the sixth thin film transistor is electrically connected to a drain of the seventh thin film transistor, and a source of the seventh thin film transistor is electrically connected to a source of the fourth thin film transistor.

In one embodiment, the gate of the fifth thin film transistor and the gate of the sixth thin film transistor are connected to a light-emitting control signal, the drain of the fifth thin film transistor is connected to a power signal, a drain of the second thin film transistor is connected to a data signal, a gate of the second thin film transistor and a gate of the third thin film transistor are connected to a first scan signal, a gate of the fourth thin film transistor is connected to a second scan signal, and a gate of the seventh thin film transistor is connected to a third scan signal.

According to the above embodiments, it should be known that the present disclosure provides an array substrate and a flexible display panel, and the array substrate comprises a substrate, an active layer, a first insulating layer, a first metal layer, a second insulating layer, a second metal layer, a transparent filling layer, and a source/drain, which are arranged in a stack. The is connected to the active terminal of the active layer through a second through-hole, and is connected to the first metal terminal of the first metal layer through a third through-hole, and is connected to a second metal terminal of the second metal layer through a fourth through-hole. Wherein a diameter of the second through-hole is greater than a diameter of the third through-hole and a diameter of the fourth through-hole, and a distance between the second through-hole and the first through-hole is greater than a predetermined distance. A risk of source/drain faults caused by excessive segment differences is reduced by increasing the diameter of the second through-hole with a larger segment difference. Due to filling of the first through-hole, the transparent filling layer near the first through-hole is uneven, which causes faults in a subsequent manufacturing process of source/drain and relieves the problem of the faults in source/drain in the current flexible display panels.

In summary, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. An array substrate, comprising:
a substrate;
an active layer formed on the substrate;
a first insulating layer formed on the active layer;
a first metal layer formed on the first insulating layer;
a second insulating layer formed on the first metal layer;
a second metal layer formed on the second insulating layer;
a third insulating layer formed on the second metal layer;
a transparent filling layer formed on the third insulating layer and contacting to the substrate through a first through-hole; and
a source/drain formed on the transparent filling layer, and connected to an active terminal of the active layer through a second through-hole, and connected to the first metal terminal of the first metal layer through a third through-hole, and connected to a second metal terminal of the second metal layer through a fourth through-hole;
wherein a diameter of the second through-hole is greater than a diameter of the third through-hole and a diameter of the fourth through-hole, and a distance between the second through-hole and the first through-hole is greater than a predetermined distance.

2. The array substrate as claimed in claim 1, wherein the active layer is patterned to form an active region, and the active region comprises a doped region and a channel region;
the first metal layer is patterned to form a gate, a first scan line, a second scan line, a third scan line, a light-emitting control line, and a first electrode plate of a storage capacitor;
the second metal layer is patterned to form a second electrode plate of the storage capacitor;
the source and the drain are connected to the doped region through the second through-hole, one terminal of the first connecting line is connected to the active terminal of the active layer through the second through-hole, and another terminal of the first connecting line is connected to the first electrode plate through the third through-hole;
one terminal of the second connecting line is connected to the active terminal of the active layer through the second through-hole; and
the power signal line is connected to the second electrode plate through the fourth through-hole.

3. The array substrate as claimed in claim 2, wherein a drain, a data signal line, a power signal line, a first connecting line, and a second connecting line formed from the source/drain are further included, the data signal line, the power signal line, the first connecting line, and the second connecting line are arranged in parallel.

4. The array substrate as claimed in claim 2, wherein the first electrode plate is formed opposite to the second electrode plate, and a projection of the second electrode plate on the substrate covers a projection of the first electrode plate on the substrate.

5. The array substrate as claimed in claim 2, wherein the diameter of the third through-hole is greater than or equal to the diameter of the fourth through-hole.

6. The array substrate as claimed in claim 5, wherein the diameter of the second through-hole is greater than 2.5 µm.

7. The array substrate as claimed in claim 6, wherein the diameter of the second through-hole is 3 µm, 3.5 µm, or 4 µm.

8. The array substrate as claimed in claim 1, wherein the distance between the second through-hole and the first through-hole is greater than 3 µm.

9. The array substrate as claimed in claim 1, wherein the array substrate comprises a plurality of pixel driving circuits, the pixel driving circuits comprises a first thin film transistor, a second thin film transistor, a third thin film transistor, a fourth thin film transistor, a fifth thin film transistor, a sixth thin film transistor, a seventh thin film transistor, and a storage capacitor; and
a drain of the first thin film transistor is electrically connected to a source of the fifth thin film transistor and a source of the second thin film transistor, a source of the first thin film transistor is electrically connected to a drain of the third thin film transistor and a drain of the sixth thin film transistor, a gate of the first thin film transistor is electrically connected to a source of the third thin film transistor, a drain of the fourth thin film transistor, and a first electrode plate of the storage capacitor, a second electrode plate of the storage capacitor is electrically connected to a drain of the fifth thin film transistor, a gate of the fifth thin film transistor is electrically connected to a gate of the sixth thin film transistor, a source of the sixth thin film transistor is electrically connected to a drain of the seventh thin film transistor, and a source of the seventh thin film transistor is electrically connected to a source of the fourth thin film transistor.

10. The array substrate as claimed in claim 9, wherein the gate of the fifth thin film transistor and the gate of the sixth thin film transistor are connected to a light-emitting control signal, the drain of the fifth thin film transistor is connected to a power signal, a drain of the second thin film transistor is connected to a data signal, a gate of the second thin film transistor and a gate of the third thin film transistor are connected to a first scan signal, a gate of the fourth thin film transistor is connected to a second scan signal, and a gate of the seventh thin film transistor is connected to a third scan signal.

11. A flexible display panel comprising an array substrate, wherein the array substrate comprises:
a substrate;
an active layer formed on the substrate;
a first insulating layer formed on the active layer;
a first metal layer formed on the first insulating layer;
a second insulating layer formed on the first metal layer;
a second metal layer formed on the second insulating layer;
a third insulating layer formed on the second metal layer;
a transparent filling layer formed on the third insulating layer and contacting to the substrate through a first through-hole; and
a source/drain formed on the transparent filling layer, and connected to an active terminal of the active layer through a second through-hole, and connected to the first metal terminal of the first metal layer through a third through-hole, and connected to a second metal terminal of the second metal layer through a fourth through-hole;
wherein a diameter of the second through-hole is greater than a diameter of the third through-hole and a diameter of the fourth through-hole, and a distance between the second through-hole and the first through-hole is greater than a predetermined distance.

12. The flexible display panel as claimed in claim 11, wherein the active layer is patterned to form an active region, and the active region comprises a doped region and a channel region;

the first metal layer is patterned to form a gate, a first scan line, a second scan line, a third scan line, a light-emitting control line, and a first electrode plate of a storage capacitor;

the second metal layer is patterned to form a second electrode plate of the storage capacitor;

the source and the drain are connected to the doped region through the second through-hole, one terminal of the first connecting line is connected to the active terminal of the active layer through the second through-hole, and another terminal of the first connecting line is connected to the first electrode plate through the third through-hole;

one terminal of the second connecting line is connected to the active terminal of the active layer through the second through-hole; and the power signal line is connected to the second electrode plate through the fourth through-hole.

13. The flexible display panel as claimed in claim 12, wherein a drain, a data signal line, a power signal line, a first connecting line, and a second connecting line formed from the source/drain are further included, the data signal line, the power signal line, the first connecting line, and the second connecting line are arranged in parallel.

14. The flexible display panel as claimed in claim 12, wherein the first electrode plate is formed opposite to the second electrode plate, and a projection of the second electrode plate on the substrate covers a projection of the first electrode plate on the substrate.

15. The flexible display panel as claimed in claim 12, wherein the diameter of the third through-hole is greater than or equal to the diameter of the fourth through-hole.

16. The flexible display panel as claimed in claim 15, wherein the diameter of the second through-hole is greater than 2.5 µm.

17. The flexible display panel as claimed in claim 16, wherein the diameter of the second through-hole is 3 µm, 3.5 µm, or 4 µm.

18. The flexible display panel as claimed in claim 11, wherein the distance between the second through-hole and the first through-hole is greater than 3 µm.

19. The flexible display panel as claimed in claim 11, wherein the array substrate comprises a plurality of pixel driving circuits, the pixel driving circuits comprises a first thin film transistor, a second thin film transistor, a third thin film transistor, a fourth thin film transistor, a fifth thin film transistor, a sixth thin film transistor, a seventh thin film transistor, and a storage capacitor; and a drain of the first thin film transistor is electrically connected to a source of the fifth thin film transistor and a source of the second thin film transistor, a source of the first thin film transistor is electrically connected to a drain of the third thin film transistor and a drain of the sixth thin film transistor, a gate of the first thin film transistor is electrically connected to a source of the third thin film transistor, a drain of the fourth thin film transistor, and a first electrode plate of the storage capacitor, a second electrode plate of the storage capacitor is electrically connected to a drain of the fifth thin film transistor, a gate of the fifth thin film transistor is electrically connected to a gate of the sixth thin film transistor, a source of the sixth thin film transistor is electrically connected to a drain of the seventh thin film transistor, and a source of the seventh thin film transistor is electrically connected to a source of the fourth thin film transistor.

20. The flexible display panel as claimed in claim 19, wherein the gate of the fifth thin film transistor and the gate of the sixth thin film transistor are connected to a light-emitting control signal, the drain of the fifth thin film transistor is connected to a power signal, a drain of the second thin film transistor is connected to a data signal, a gate of the second thin film transistor and a gate of the third thin film transistor are connected to a first scan signal, a gate of the fourth thin film transistor is connected to a second scan signal, and a gate of the seventh thin film transistor is connected to a third scan signal.

* * * * *